United States Patent
Ding et al.

(10) Patent No.: US 8,823,136 B2
(45) Date of Patent: Sep. 2, 2014

(54) ON CHIP INDUCTOR WITH FREQUENCY DEPENDENT INDUCTANCE

(71) Applicant: International Business Machines Corporation, Armonk, NY (US)

(72) Inventors: Hanyi Ding, Colchester, VT (US); Wayne H. Woods, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/771,668

(22) Filed: Feb. 20, 2013

(65) Prior Publication Data

US 2013/0161785 A1   Jun. 27, 2013

Related U.S. Application Data

(60) Continuation of application No. 13/738,367, filed on Jan. 10, 2013, which is a division of application No. 12/632,030, filed on Dec. 7, 2009, now Pat. No. 8,378,448.

(60) Provisional application No. 61/161,107, filed on Mar. 18, 2009.

(51) Int. Cl.
*H01L 21/48* (2006.01)
*H01L 21/768* (2006.01)
*H01L 21/3105* (2006.01)

(52) U.S. Cl.
CPC .... *H01L 21/76826* (2013.01); *H01L 21/76808* (2013.01); *H01L 29/4324* (2013.01); *H01L 21/31053* (2013.01)
USPC ........... 257/532; 257/535; 257/765; 257/769; 257/E23.002; 257/E23.146; 257/E27.046; 257/E27.081; 257/E27.097

(58) Field of Classification Search
CPC ..................... H01I 21/02063; H01I 21/02126; H01I 21/02203; H01I 21/02318; H01I 21/02362; H01I 21/31053; H01I 21/76878; H01I 21/76808; H01I 21/07614; H01I 21/076831; H01L 29/42324
USPC ................. 257/531–535, 701, 765–769, 777, 257/E23.002, 143, 152, 25.001, 27.046, 81, 257/85, 97

See application file for complete search history.

(56) References Cited

U.S. PATENT DOCUMENTS

5,032,738 A   7/1991   Vithayathil
5,933,725 A   8/1999   Kirsch et al.
(Continued)

FOREIGN PATENT DOCUMENTS

DE   10063606 A1   7/2001

OTHER PUBLICATIONS

Huang et al., "Direct Synthesis of Tubular Bandpass Filters With Frequency-Dependent Inductors", 1998, IEEE, pp. 371-374.
(Continued)

*Primary Examiner* — Michael Lebentritt
(74) *Attorney, Agent, or Firm* — Scully, Scott, Murphy & Presser, P.C.; Anthony J. Canale

(57) ABSTRACT

A set of metal line structures including a signal transmission metal line and a capacitively-grounded inductively-signal-coupled metal line is embedded in a dielectric material layer. A capacitor is serially connected between the capacitively-grounded inductively-signal-coupled metal line and a local electrical ground, which may be on the input side or on the output side. The set of metal line structures and the capacitor collective provide a frequency dependent inductor. The Q factor of the frequency dependent inductor has multiple peaks that enable the operation of the frequency dependent inductor at multiple frequencies. Multiple capacitively-grounded inductively-signal-coupled metal lines may be provided in the frequency-dependent inductor, each of which is connected to the local electrical ground through a capacitor. By selecting different capacitance values for the capacitors, multiple values of the Q-factor may be obtained in the frequency dependent inductor at different signal frequencies.

20 Claims, 8 Drawing Sheets

(56) References Cited

U.S. PATENT DOCUMENTS

| | | | |
|---|---|---|---|
| 5,977,558 | A | 11/1999 | Lee |
| 6,180,503 | B1 | 1/2001 | Tzeng et al. |
| 6,303,423 | B1 | 10/2001 | Lin |
| 6,438,394 | B1 | 8/2002 | Zhang et al. |
| 6,529,750 | B1 | 3/2003 | Zhang et al. |
| 6,549,445 | B2 | 4/2003 | Ooishi et al. |
| 6,608,736 | B1 | 8/2003 | Klaassen et al. |
| 6,661,079 | B1 | 12/2003 | Bikulcius |
| 6,720,232 | B1 | 4/2004 | Tu et al. |
| 7,016,490 | B2 | 3/2006 | Beutler et al. |
| 7,136,274 | B2 | 11/2006 | Hwang et al. |
| 7,190,239 | B2 | 3/2007 | Fujimoto et al. |
| 7,202,704 | B2 | 4/2007 | Chu et al. |
| 7,535,080 | B2 | 5/2009 | Zeng et al. |
| 7,741,935 | B2 | 6/2010 | Chow et al. |
| 8,150,638 | B1 | 4/2012 | Wu et al. |
| 8,405,453 | B2 * | 3/2013 | Woods et al. ............... 327/553 |
| 2005/0007213 | A1 | 1/2005 | Nakajima et al. |
| 2006/0132258 | A1 | 6/2006 | Ogle |
| 2006/0232348 | A1 | 10/2006 | Hino |
| 2007/0001260 | A1 | 1/2007 | Zeng et al. |
| 2007/0123176 | A1 | 5/2007 | Han et al. |
| 2009/0194768 | A1 | 8/2009 | Leedy |
| 2012/0019313 | A1 | 1/2012 | Woods et al. |
| 2012/0080797 | A1 | 4/2012 | Daubenspeck et al. |

OTHER PUBLICATIONS

Zhang, D. et al., "Narrowband Lumped-Element Microstrip Filters Using Capacitively-Loaded Inductors", Dec. 1995, Transactions on Microwave Theory and Techniques, vol. 43, No. 12, pp. 3030-3036.

Zhang, D. et al., "Narrowband Lumped-Element Microstrip Filters Using Capacitively-Loaded Inductors", Dec. 1995, IEEE MIT-S Digest (WE1C1) pp. 379-382.

Office Action dated Feb. 5, 2014 received in a related U.S. Patent Application, namely U.S. Appl. No. 13/738,367.

* cited by examiner

ON CHIP INDUCTOR WITH FREQUENCY DEPENDENT INDUCTANCE

CROSS REFERENCE TO RELATED APPLICATION

This application is a continuation of U.S. patent application Ser. No. 13/738,367 filed on Jan. 13, 2013, which is a divisional of U.S. patent application Ser. No. 12/632,030, filed Dec. 7, 2009, which claims the benefit of priority from U.S. Provisional Ser. No. 61/161,107 filed on Mar. 18, 2009, the entire content and disclosure of which are incorporated herein by reference.

The present invention relates to a semiconductor structure including an on-chip inductor with frequency-dependent inductance, a semiconductor circuit for the same, and a design structure for the same.

On-chip inductors are used in semiconductor structures for analog applications. Frequently, on-chip inductors are employed with other semiconductor components to form a resonant circuit having a high Q factor. The Q factor, or the quality factor, is a metric of performance of a resonant system. The Q factor of a resonant system is given by $2\pi$ times the energy stored in the resonant system divided by energy loss per cycle. A resonant system with a high Q-factor is capable of holding the stored energy in the system for many periods of the oscillation frequency of the system.

On-chip inductors are typically formed as a set of at least one metal line within a back-end-of-line (BEOL) dielectric material layer stack. Since the BEOL dielectric material layer stack is employed to form other metal interconnect structures, such on-chip inductors may be formed employing standard semiconductor processing steps without employing additional processing steps or additional masks.

Skin depth effect on the surface of metal lines influences the inductance of on-chip inductors especially on high frequency operations. The skin depth $\delta_s$ of a metal in MKS unit system, i.e., in meters, is given by:

$$\delta_s = \sqrt{\frac{2\rho}{2\pi f \mu_0 \mu_R}},$$

wherein $\rho$ is the bulk resistivity of the metal in Ohm-meters, f is the frequency of the electromagnetic radiation, $\mu_0$ is a permeability constant of vacuum which is $4\pi \times 10^{-7}$ Henries/meter, and $\mu_R$ is relative permeability, which is usually about 1.0 for most non-ferromagnetic materials. The skin depth $\delta_s$ is about 2 microns at about 1 GHz and about 0.2 microns at about 100 GHz for most highly conductive materials such as Au, Ag, Cu and Al.

Other than the skin depth effect, which causes the inductance of on-chip inductors to slowly decrease with frequency of the electrical signal in the on-chip inductor, the on-chip inductors have otherwise substantially frequency independent inductance. For practical purposes of circuit design, therefore, on-chip inductors may have only one target inductance value.

Many semiconductor circuits require, however, different values of inductance at different signal frequencies for optimal performance. In view of the above, therefore, there exists a need for a semiconductor structure including an on-chip inductor having a frequency-dependent inductance, a semiconductor circuit for the same, and a design structure for the same.

SUMMARY

The present invention provides a semiconductor structure including an on-chip inductor having multiple frequency-dependent inductance ranges, and a design structure and a semiconductor circuit for the same.

In the present invention, a set of metal line structures including a signal transmission metal line, a grounded inductively coupled metal line, and a capacitively-grounded inductively-signal-coupled metal line that are embedded in a dielectric material layer. The grounded inductively coupled metal line is grounded at the input signal side and at the output signal side. A capacitor is serially connected between the capacitively-grounded inductively-signal-coupled metal line and a local electrical ground, which may be on the input side or on the output side. The substrate has a finite resistance between a first local ground at the signal input side and a second local ground at the signal output side.

At a low frequency, the capacitor electrically disconnects the capacitively-grounded inductively-signal-coupled metal line from the local electrical ground, thereby inhibiting an inductive coupling between the signal transmission metal line and the capacitively-grounded inductively-signal-coupled metal line. At a high frequency, the capacitor electrically connects the capacitively-grounded inductively-signal-coupled metal line to the local electrical ground, thereby enabling the inductive coupling between the signal transmission metal line and the capacitively-grounded inductively-signal-coupled metal line.

The set of metal line structures and the capacitor collective provide a frequency dependent inductor. The Q factor of the frequency dependent inductor has multiple peaks that enable the operation of the frequency dependent inductor at multiple frequencies.

Multiple capacitively-grounded inductively-signal-coupled metal lines may be provided in the frequency-dependent inductor, each of which is connected to the local electrical ground through a capacitor. By selecting different capacitance values for the capacitors, multiple values of the Q-factor may be obtained in the frequency dependent inductor at different signal frequencies.

According to an aspect of the present invention, a design structure embodied in a machine readable medium for designing, manufacturing, or testing a design for a semiconductor structure is provided. The design structure comprises:
a first data representing a dielectric material layer located on a semiconductor substrate;
a second data representing a first metal line embedded in the dielectric material layer;
a third data representing a second metal line embedded in the dielectric material layer and inductively coupled with the first metal line through a portion of the dielectric material layer; and
a fourth data representing a capacitor having a first capacitor electrode and a second capacitor electrode, wherein the first capacitor electrode is resistively connected to an end of the second metal line, and wherein the second capacitor electrode is electrically grounded.

In one embodiment, the design structure further comprises:
a fifth data representing a first device located on the semiconductor substrate, wherein a first end of the first metal line is resistively connected to the first device; and
a sixth data representing a second device located on the semiconductor substrate, wherein a second end of the first metal line is resistively connected to the second device.

In another embodiment, the design structure further comprises an additional data representing a grounded metal line embedded in the dielectric material layer and inductively coupled with the first metal line and grounded to the semiconductor substrate at a first end of the grounded metal line in proximity to the first device and grounded to the semiconductor substrate at a second end of the grounded metal line in proximity to the second device.

In yet another embodiment, the design structure further comprises at least one additional data, each representing a capacitively-grounded metal line structure comprising:

an additional metal line embedded in the dielectric layer and inductively coupled with the first metal line through a portion of the dielectric material layer; and an additional capacitor having a first additional capacitor electrode and a second additional capacitor electrode, wherein the first additional capacitor electrode is resistively connected to an end of the additional metal line, and wherein the second additional capacitor electrode is electrically grounded.

According to another aspect of the present invention, a semiconductor circuit represented in a circuit schematic or a design structure embodied in a machine readable medium for designing, manufacturing, or testing a design for a semiconductor structure is provided. The semiconductor circuit comprises:

a signal transmission line having a self-inductance;

a first device including a first signal input node directly connected to a first end of the signal transmission line and a second signal input node directly connected to electrical ground;

a second device including a first signal output node directly connected to a second end of the signal transmission line and a second signal output node directly connected to electrical ground;

a inductive circuit element having a mutual inductance with the signal transmission line through inductive coupling; and a capacitor having a first capacitor node and a second capacitor node, wherein the first capacitor node is directly connected to an end of the inductive circuit element, and wherein the second capacitor node is electrically grounded.

In one embodiment, the semiconductor circuit further comprises another inductive circuit element inductively coupled with the signal transmission line and directly connected to the second signal input node and the second signal output node.

In another embodiment, the semiconductor circuit further comprises:

an additional inductive circuit element having a mutual inductance with the signal transmission line through inductive coupling; and an additional capacitor having a first additional capacitor node and a second additional capacitor node, wherein the first additional capacitor node is directly connected to an end of the additional inductive circuit element, and wherein the second additional capacitor node is electrically grounded.

In yet another embodiment, a total inductance of the signal transmission line as a function of frequency includes divergent singularities between 1 GHz and 1 THz.

According to yet another aspect of the present invention, a semiconductor structure is provided, which comprises:

a first metal line embedded in a dielectric material layer located on a semiconductor substrate and resistively connected to a first device at a first end of the first metal line and resistively connected to a second device at a second end of the first metal line;

a second metal line embedded in the dielectric material layer and inductively coupled with the first metal line through a portion of the dielectric material layer; and a capacitor having a first capacitor electrode and a second capacitor electrode, wherein the first capacitor electrode is resistively connected to an end of the second metal line, and wherein the second capacitor electrode is electrically grounded.

In one embodiment, the first device is a signal transmitting device and the second device is a signal receiving device and the first metal line is a signal transmission line.

In another embodiment, the semiconductor device further comprises a grounded metal line embedded in the dielectric material layer and inductively coupled with the first metal line and grounded to the semiconductor substrate at a first end of the grounded metal line in proximity to the first device and grounded to the semiconductor substrate at a second end of the grounded metal line in proximity to the second device.

In yet another embodiment, the semiconductor structure further comprises at least one additional capacitively-grounded metal line structure, wherein each of the at least one additional capacitively-grounded line structure comprises:

an additional metal line embedded in the dielectric layer and inductively coupled with the first metal line through a portion of the dielectric material layer; and an additional capacitor having a first additional capacitor electrode and a second additional capacitor electrode, wherein the first additional capacitor electrode is resistively connected to an end of the additional metal line, and wherein the second additional capacitor electrode is electrically grounded.

DETAILED DESCRIPTION

Figure 1:
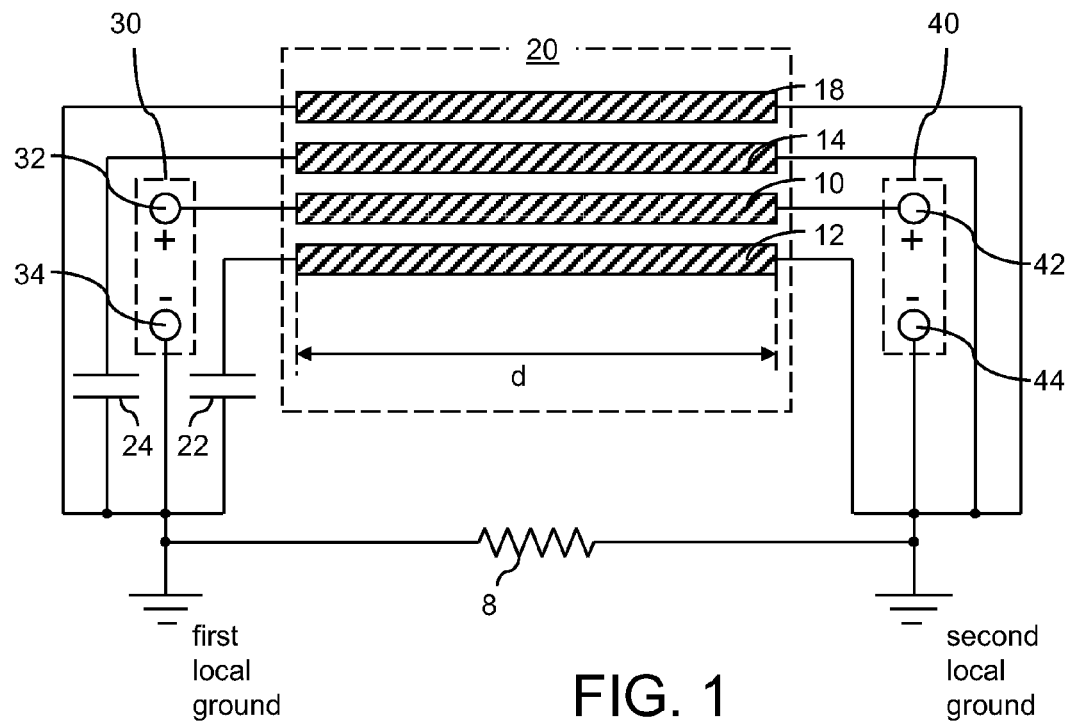
FIG. 1 is a composite view of a schematic top-down view of a set of metal lines 20 and a circuit schematic for the rest of the components of a first exemplary semiconductor structure according to the present invention.

As stated above, the present invention relates to a semiconductor structure including an on-chip inductor with frequency-dependent inductance, a semiconductor circuit for the same, and a design structure for the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element. Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

Referring to FIG. 1, a first exemplary semiconductor structure according to the present invention comprises a set of metal lines 20 including a signal transmission line 10, a signal transmitting device 30 including a first signal input structure represented by a first signal input node 32, and a signal receiving device 40 including a first signal receiving structure represented by a first signal output node 42. An alternating current (AC) electrical signal is applied across the first signal input node 32 and a second signal input node 34, which is electrically grounded to a first local ground. The AC electrical signal may have a frequency from about 1 GHz to about 1 THz, although the structure of the present invention may be employed for any AC frequency. The AC electrical signal is transmitted to the signal receiving device 40 across the first signal output node 42 and a second signal output node, which is electrically grounded to a second local ground.

The term "local ground" is employed herein to denote electrical ground that is effective locally. This phenomenon occurs when the conductor material constituting the electrical ground has lesser or comparable conductivity relative to the transmission line. For example, the portion of the semiconductor constituting the first and second local electrical ground may comprise a semiconductor material which has a lower conductivity than the transmission line. In this case, the semiconductor substrate has a finite resistance between the first local ground at the signal input side and the second local ground at the signal output side. The resistance of the semiconductor substrate between the first local ground and the second local ground is represented by a resistor 8.

The set of metal lines 20 includes at least one capacitively-grounded metal line, which is serially connected to a capacitor between the first local ground and the second local ground. For example, the set of metal lines 20 may include a first capacitively-grounded metal line 12 and a second capacitively-grounded metal line 14. A serial connection of the first capacitively-grounded metal line 12 and a first capacitor 22 constitutes a first capacitively-grounded metal line structure (12, 22), and a serial connection of a second capacitively-grounded metal line 14 and a second capacitor 24 constitutes a second capacitively-grounded metal line structure (14, 24). Further, the set of metal lines 20 may include a grounded metal line 18 which is directly connected to the first local ground and the second local ground. The grounded metal line 18 is inductively coupled with the signal transmission line 10. The grounded metal line 18 is grounded to a semiconductor substrate at a first end of the grounded metal line 18 in proximity to the signal transmitting device 30. Further, the grounded metal line 18 is grounded to the semiconductor substrate at a second end of the grounded metal line 18 in proximity to the signal receiving device 40. The grounded metal line 18 functions as a ground return line for the signal transmission line 10 since the grounded metal line 18 provides a lower impedance than the resistance of the semiconductor substrate which is represented by the resistor 8.

Each of the first capacitively-grounded metal line 12, the second capacitively-grounded metal line 24, and the grounded metal line 18 is inductively coupled to the signal transmission line 10. The grounded metal line 18 is a portion of a closed circuit including the grounded metal line 18 and the resistor 8 that are connected at the first local ground and the second local ground. Thus, the mutual inductance between the grounded metal line 18 and the signal transmission line 10 affects the current flow in the signal transmission line. The length d of the metal lines (10, 12, 14, 18) may be from about 5 microns to about 10,000 microns, although lesser and greater lengths are also contemplated herein.

The effect of the first and second capacitors (22, 24) on the circuit characteristics is frequency-dependent. At a high frequency limit at which the impedances of the first and second capacitors (22, 24) approach zero, each of the first capacitively-grounded metal line structure (12, 22) and the second capacitively-grounded metal line structure (14, 24) becomes a part of a closed circuit including the resistor 8. Thus, the mutual impedance between the signal transmission line 10 and each of the first and second capacitors (22, 24) affects the current flow in the signal transmission line 10.

At a low frequency limit at which the impedances of the first and second capacitors (22, 24) approach infinity, circuits including the first capacitively-grounded metal line structure (12, 22) and the second capacitively-grounded metal line structure (14, 24) become electrically open. Thus, the mutual inductance between the signal transmission line 10 and each of the first and second capacitors (22, 24) does not affect the current flow in the signal transmission line 10.

The impedance of a capacitor having a capacitance C for a sinusoidal electrical signal is given by $1/j\omega C$, in which j is a unit of an imaginary number, ω is the angular frequency of a sinusoidal electrical signal, and C is the capacitance of the capacitor. The angular frequency ω is given by 2πf, in which f is the frequency of the sinusoidal signal. The impedance of an inductor having a self-inductance L and a mutual inductance M is given by jω(L+M). Thus, a serial connection of a capacitor and an inductor has a total impedance of jω(L+M)+ 1/jωC, which may be expressed as jω(L+M)(1−1/ω²(L+M)C). The serial connection of the capacitor and the inductor functions as an inductor having an effective inductance L'= (L+M){1−1/ω²(L+M)C}. When $$\omega = \sqrt{\frac{1}{(L+M)C}},$$

or $$f = \frac{1}{2\pi}\sqrt{\frac{1}{(L+M)C}},$$

the effective total inductance L', which is given by L'=(L+M) {1−1/ω²(L+M)C} has divergent singularities. While parasitic effects in the physical structure prevents divergence of the effective mutual inductance L' to positive or negative infinity, the divergent singularities are preserved even with the effect of the parasitic effects.

Such characteristic of divergent singularities are present in each of the first capacitively-grounded metal line structure (12, 22) and the second capacitively-grounded metal line structure (14, 24). When the first and second capacitors (22, 24) have different capacitance values, the first capacitively-grounded metal line structure (12, 22) and the second capacitively-grounded metal line structure (14, 24) become parts of closed circuits at different frequencies. Since each of the closed circuits are in parallel connection to each other, the total impedance of the signal transmission line 10 decreases as each of the closed circuits are added. Thus, the total impedance of the signal transmission line 10 becomes more frequency-dependent than mere decrease due to the skin depth effect.

Figure 2:
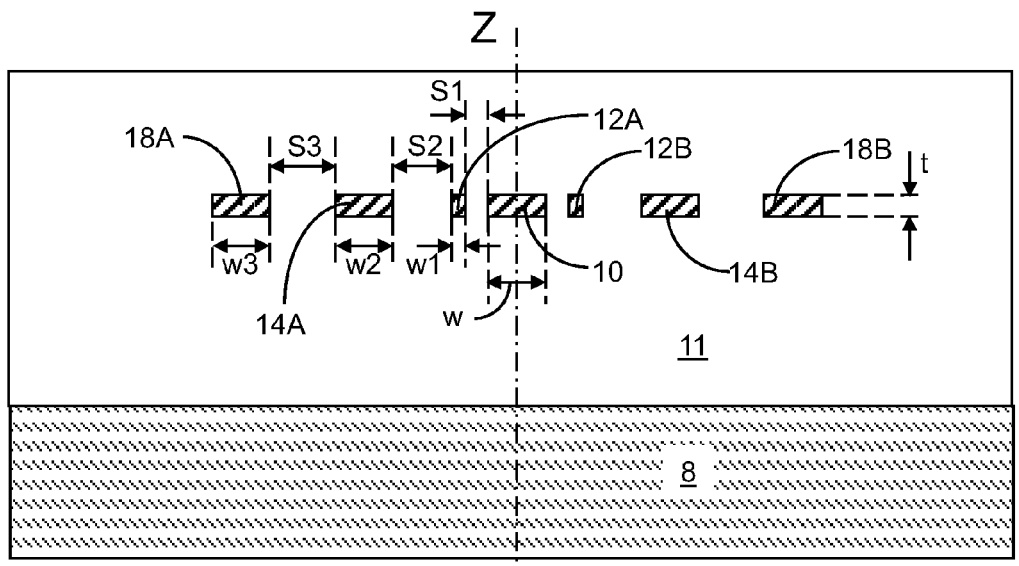
FIG. 2 is a vertical cross-sectional view of the first exemplary semiconductor structure according to the present invention.
Figure 3:
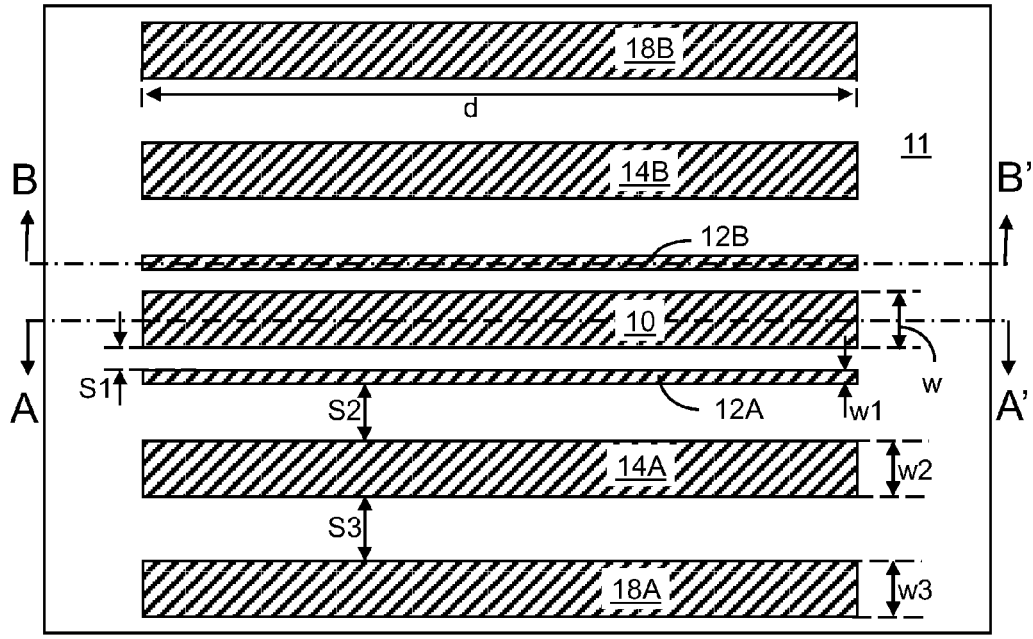
FIG. 3 is a horizontal cross-sectional view of the first exemplary semiconductor structure according to the present invention.

Referring to FIGS. 2 and 3, the first exemplary semiconductor structure according to the present invention is shown. FIG. 2 is a vertical cross-sectional view of the first exemplary semiconductor structure, and FIG. 3 is a horizontal cross-sectional view of the first exemplary semiconductor structure across a horizontal plane including the signal transmission line 10.

The first exemplary semiconductor structure comprises a semiconductor substrate 8 and a dielectric material layer 11. At least one semiconductor device is provided on the semiconductor substrate 8. The dielectric material layer 11 comprises at least one dielectric material. Exemplary dielectric materials that may be employed for the dielectric material layer 11 include, but are not limited to a silicate glass, an organosilicate glass (OSG) material, a SiCOH-based low-k material formed by chemical vapor deposition, a spin-on glass (SOG), or a spin-on low-k dielectric material such as SiLK™, etc. The silicate glass includes an undoped silicate glass (USG), borosilicate glass (BSG), phosphosilicate glass (PSG), fluorosilicate glass (FSG), borophosphosilicate glass (BPSG), etc. The dielectric material may be a low dielectric constant (low-k) material having a dielectric constant less than 3.0. The dielectric material may be non-porous or porous. The dielectric material layer 11 may include a plurality of the dielectric materials described above. The dielectric materials of the dielectric material layer 11 may be formed by plasma enhanced chemical vapor deposition, high density plasma chemical vapor deposition, thermal chemical vapor deposition, spin coat and cure, etc. The thickness of the dielectric material layer 11 may be from about 0.1 μm to about 20 μm, and typically from about 1 μm to about 10 μm, although lesser and greater thicknesses are also contemplated herein.

The first exemplary semiconductor structure has mirror symmetry around the plane Z-Z'. The signal transmission line 10 is implemented as a single line having a width w and a thickness t. The first capacitively-grounded metal line 12 of FIG. 1 is implemented as a pair of a first-side first capacitively-grounded metal line 12A and a second-side first capacitively-grounded metal line 12B, each of which has a first width w1 and are laterally spaced from the signal transmission line by a first spacing S1. The second capacitively-grounded metal line 14 of FIG. 1 is implemented as a pair of a first-side second capacitively-grounded metal line 14A and a second-side second capacitively-grounded metal line 14B, each of which has a second width w2. The first-side second capacitively-grounded metal line 14A is laterally spaced from the first-side first capacitively-grounded metal line 12A by a second spacing S2. The second-side second capacitively-grounded metal line 14B is laterally spaced from the second-side first capacitively-grounded metal line 12B by the second spacing S2. The grounded metal line 18 of FIG. 1 is implemented as a pair of a first-side grounded metal line 18A and a second-side grounded metal line 18B, each of which has a third width w3. The first-side grounded metal line 18A is laterally spaced from the first-side second capacitively-grounded metal line 14A by a third spacing S3. The second-side grounded metal line 18B is laterally spaced from the second-side second capacitively-grounded metal line 14B by the third spacing S3.

The signal transmission line 10, the first-side first capacitively-grounded metal line 12A, the second-side first capacitively-grounded metal line 12B, the first-side second capacitively-grounded metal line 14A, the second-side second capacitively-grounded metal line 14B, the first-side grounded metal line 18A, and the second-side grounded metal line 18B are located at a same level within the dielectric material layer 11, i.e., are spaced from the semiconductor substrate by a same distance.

Each of the metal lines (10, 12A, 12B, 14A, 14B, 18A, 18B) has sidewalls that are substantially parallel among one another. The sidewalls may be substantially vertical. The sidewalls are separated from one another by a substantially constant spacing. Two sidewalls belonging to a neighboring pair of metal lines are separated from each other by a portion of the dielectric material layer 11. The spacing between a sidewall of the signal transmission line 10 and sidewalls of the rest of the metal lines (12A, 12B, 14A, 14B, 18A, 18B) may be from about 0.2 micron to about 100 microns, although lesser and greater spacings are also contemplated herein.

While the present invention is described with exemplary semiconductor structures including lines located at the same level in the dielectric material layer 11, the metal lines need not be located at the same level as long as inductive coupling is proved among them. Therefore, embodiments in which the metal lines are located at different levels within the dielectric material layer 11, i.e., the vertical spacing between the metal lines and the semiconductor substrate varies from metal line to metal line, are explicitly contemplated herein.

Each of the metal lines (10, 12A, 12B, 14A, 14B, 18A, 18B) may be formed during formation of back-end-of-line (BEOL) metal interconnect structures. Particularly, each of the metal lines (10, 12A, 12B, 14A, 14B, 18A, 18B) may be formed concurrently with formation of other metal lines.

In one case, at least one of the metal lines (10, 12A, 12B, 14A, 14B, 18A, 18B) comprises electroplated copper, which consists essentially of Cu and impurities. The impurities comprise O, N, C, Cl, and S, and the total concentration of the impurities is from about 1 ppm to about 200 ppm. All of the metal lines (10, 12A, 12B, 14A, 14B, 18A, 18B) may comprise electroplated copper.

In another case, at least one of the metal lines (10, 12A, 12B, 14A, 14B, 18A, 18B) comprises an aluminum wiring structure. For example, the at least one of the metal lines (10, 12A, 12B, 14A, 14B, 18A, 18B) may comprise a vertical stack of a bottom metal nitride liner, an aluminum portion located on the bottom metal nitride liner, and a top metal nitride liner located on the aluminum portion. All of the metal lines (10, 12A, 12B, 14A, 14B, 18A, 18B) may comprise an aluminum wiring structure.

In addition, other metal interconnect materials may be employed for at least one of the metal lines (10, 12A, 12B, 14A, 14B, 18A, 18B). Such metal interconnect materials include W, WN, Ta, TaN, Ti, TiN, Au, and Ag.

Figure 4:
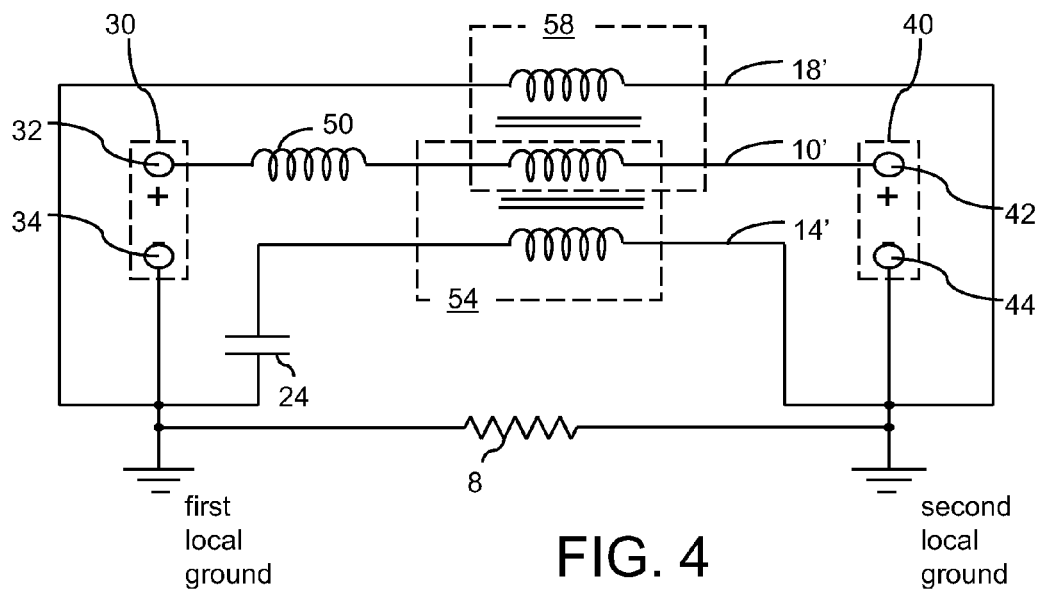
FIG. 4 is a circuit schematic of a second exemplary semiconductor structure according to the present invention.

Referring to FIG. 4, a circuit schematic of a second exemplary semiconductor structure according to the present invention is shown. The second exemplary semiconductor structure may be derived from the first exemplary semiconductor structure in FIG. 1 by removing the first capacitively-grounded metal line 12 and the first capacitor 22. The circuit schematic of the second exemplary semiconductor structure includes a signal transmission path 10', a second capacitively-grounded path 14', and a grounded path 18'. The signal transmission path 10' includes an inductor 50 having a self-inductance L. A first mutually inductive inductor 58 having a first mutual inductance M1 is provided between the signal transmission path 10' and the grounded path 18'. A second mutually inductive inductor 52 having a second mutual inductance M2 is provided between the signal transmission path 10' and the second capacitively grounded path 14'. The signal transmission path 10' including the inductor 50 corresponds to the signal transmission line 10 of FIG. 1, the second capacitively-grounded path 14' corresponds to the second capacitively-grounded metal line 14 in FIG. 1, and the grounded path 18' corresponds to the grounded metal line 18 in FIG. 1.

The first mutually inductive inductor 58 contributes a substantially frequency-independent first mutual inductance M1 to the circuit. The impedance contribution of the serial connection of the second capacitively-grounded path 14' and the second capacitor 24 is given by $M2 \times \{1 - 1/(\omega^2 \times M2 \times C2)\}$, wherein C2 is a second capacitance, i.e., the capacitance of the second capacitor 24.

The total impedance of the signal transmission line 10 is given by $j\omega L + j\omega M1 + j\omega M2 + 1/j\omega C2$. The characteristics of the circuit changes around the frequency at which the magnitude of the impedance $1/j\omega C2$ of the second capacitor 24 becomes equal to the sum of a first impedance $j\omega L$ due to the self-inductance L and a second impedance due to the total mutual impedance $j\omega M1 + j\omega M2$. Preferably, this frequency is within the range from about 1 GHz to about 1 THz.

The circuit of FIG. 4 may be obtained by removing the first-side and second-side first capacitively-grounded metal lines (12A, 12B) in the first exemplary semiconductor structure, or alternatively, by providing a first capacitor 22 which has a small enough capacitance so that the impedance of the first capacitor 22 overwhelms all other impedances in the circuit.

In general, a plurality of capacitively-grounded paths to a plurality of capacitively-grounded metal lines may be provided in a circuit so that the behavior of the circuit changes at multiple frequencies. The net effect of the frequency change is that a serial connection of a capacitively-grounded path and a capacitor may be added as a closed signal path or deactivated as an electrical open. The addition of a signal path effectively reduces the inductance of the signal transmission path 10', while deactivation of a signal path effectively increases the inductance of the signal transmission path 10'.

Figure 5:
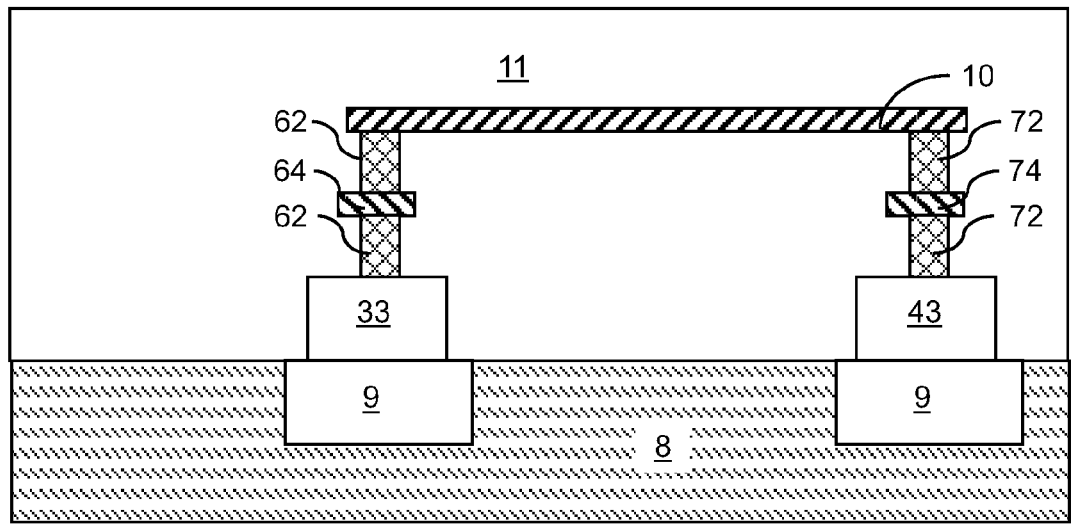
FIG. 5 is a vertical cross-sectional view of the first exemplary semiconductor structure along the plane A-A' in FIG. 3.

Referring to FIG. 5, a vertical cross-sectional view of the first exemplary semiconductor structure is shown along the plane A-A' in FIG. 3. The first exemplary semiconductor structure comprises the semiconductor substrate 8, which is typically a single crystalline semiconductor substrate such as an epitaxial silicon substrate.

A first signal input structure 33, which is a part of the signal transmitting device 30 of FIG. 1, is provided on the semiconductor substrate 8. The first signal input structure 33 may be electrically isolated from the semiconductor substrate 8 by a shallow trench isolation structure 9 embedded in the semiconductor substrate 8. The first signal input structure 33 functions as the first signal input node 32 of FIG. 1. The signal transmitting device 30 of FIG. 1 also includes a second signal input structure (not shown) which functions as the second signal input node 34 of FIG. 1. The second signal input structure is electrically grounded, i.e., directly abuts the semiconductor substrate 8, near the first signal input structure 33.

A first signal output structure 43, which is a part of the signal receiving device 40 of FIG. 1, is formed on the semiconductor substrate 8. The first signal output structure 43 may be electrically isolated from the semiconductor substrate 8 by another shallow trench isolation structure 9 embedded in the semiconductor substrate 8. The first signal output structure 43 functions as the first signal output node 42 of FIG. 1. The signal receiving device 40 of FIG. 1 also includes a second signal output structure (not shown) which functions as the second signal output node 44 of FIG. 1. The second signal output structure is electrically grounded, i.e., directly abuts the semiconductor substrate 8, near the first signal output structure 43.

The signal transmission line 10 is embedded in the dielectric material layer 11. The first end of the signal transmission line 10 is connected to a first assembly of vertically interconnecting structures which includes at least one first conductive via structure 62. The first assembly may include at least one first metal line structure 64. The second end of the signal transmission line 10 is connected to a second assembly of vertically interconnecting structures which includes at least one second conductive via structure 72. The second assembly may include at least one second metal line structure 74.

Figure 6:
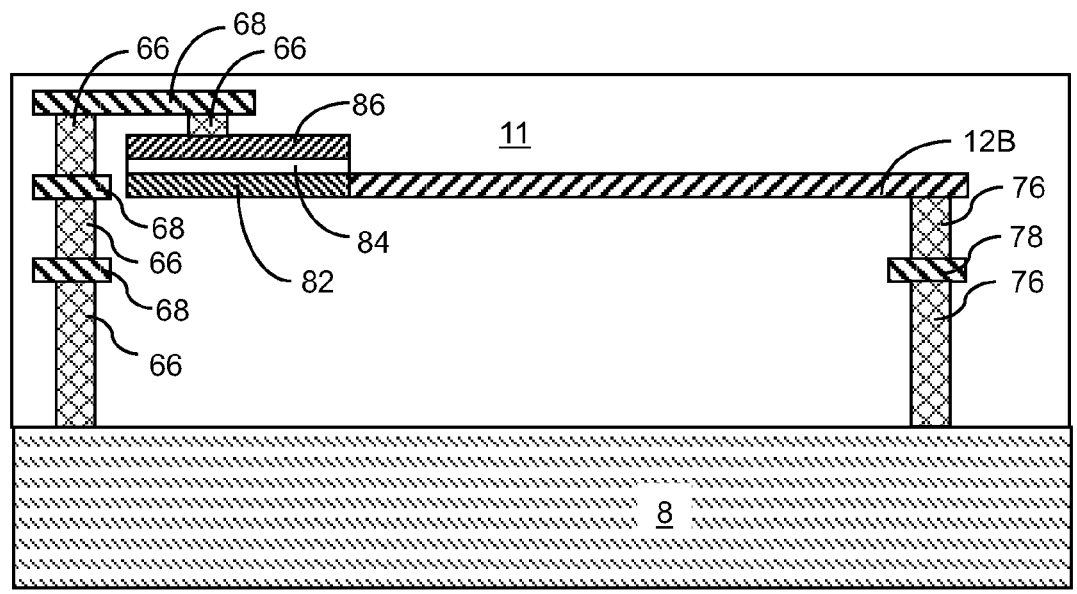
FIG. 6 is a vertical cross-sectional view of the first exemplary semiconductor structure according to a first embodiment of the present invention.

The first exemplary semiconductor structure may be implemented in many different physical embodiments. Referring to FIG. 6, a vertical cross-sectional view of a first embodiment of the first exemplary semiconductor structure is shown along the plane B-B' in FIG. 3. In the first embodiment, the first capacitor 22 is a metal-insulator-metal capacitor (MIMCAP) embedded in the dielectric material layer 11. The MIMCAP comprises a first capacitor electrode 82, a node dielectric 84, and a second capacitor electrode 86 that are vertically stacked.

The first capacitor electrode 82 is resistively connected to an end of the second-side first capacitively-grounded metal line 12B. The second capacitor electrode 86 is electrically grounded to the semiconductor substrate 8 or to a system ground node through a third assembly of vertically interconnecting structures including at least one third conductive via structure 66 embedded within the dielectric material layer 11. Alternately, the second capacitor electrode 86 may be connected to a system bus ground line that is provided as a metal interconnect structure. The third assembly may include at least one third metal line structure 68.

The other end of the second-side first capacitively-grounded metal line 12B is connected to electrical ground in proximity to the first signal output structure 43 through a fourth assembly of vertically interconnecting structures which includes at least one fourth conductive via structure 76. The second assembly may include at least one fourth metal line structure 78.

The first capacitor electrode 82 and the second-side first capacitively-grounded metal line 12B may be located in a same level within the dielectric material layer 11. In one case, the first capacitor electrode 82 and the second-side first capacitively-grounded metal line 12B may be of integral and unitary construction so that the resistance between the first capacitor electrode 82 and the second-side first capacitively-grounded metal line 12B may be minimized. In a variation of the first embodiment of the first exemplary semiconductor structure, the first capacitor electrode 82 and the second-side first capacitively-grounded metal line 12B may be formed at different levels.

Figure 7:
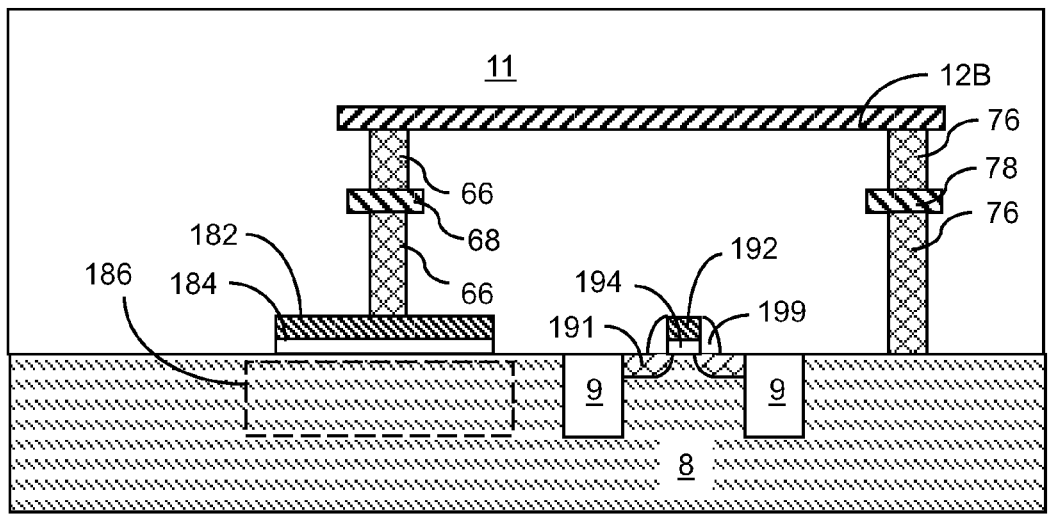
FIG. 7 is a vertical cross-sectional view of another first exemplary semiconductor structure according to a second embodiment of the present invention.

Referring to FIG. 7, a vertical cross-sectional view of a second embodiment of the first exemplary semiconductor structure is shown along the plane B-B' in FIG. 3. In the second embodiment, the first capacitor 22 is a planar capacitor located directly on the semiconductor substrate 8. The planar capacitor comprises a first capacitor electrode 182, a node dielectric 184, and a second capacitor electrode 186 that are vertically stacked. The second capacitor electrode 186 may be a portion of the semiconductor substrate 8.

The second embodiment may include a semiconductor device such a field effect transistor, which comprises a gate dielectric 194, a gate electrode 192, a gate spacer 199, and source and drain regions 191 that are formed within the semiconductor substrate 8. The field effect transistor (191, 192, 194, 199) may be electrically isolated from other semiconductor devices (not shown) and the signal transmitting device (not shown), and the signal receiving device (not shown) by shallow trench isolation structures 9. The gate dielectric 194 and the node dielectric 184 may comprise the same material. The gate electrode 192 and the first capacitor electrode 182 may comprise the same material. Thus, the gate dielectric 194 and the node dielectric 184 may be formed at the same processing step, and the gate electrode 192 and the first capacitor electrode 182 may be formed at the same processing step.

The first capacitor electrode 182 is resistively connected to an end of the second-side first capacitively-grounded metal line 12B through a third assembly of vertically interconnecting structures that include at least one third conductive via structure 66. The second capacitor electrode 186 is electrically grounded to the semiconductor substrate 8. The second capacitor electrode 186 may be formed in proximity to the first signal input structure (not shown). The third assembly may include at least one third metal line structure 68.

The other end of the second-side first capacitively-grounded metal line 12B is connected to electrical ground in proximity to the first signal output structure (not shown) through a fourth assembly of vertically interconnecting structures which includes at least one fourth conductive via structure 76. The fourth assembly may include at least one fourth metal line structure 78.

Figure 8:
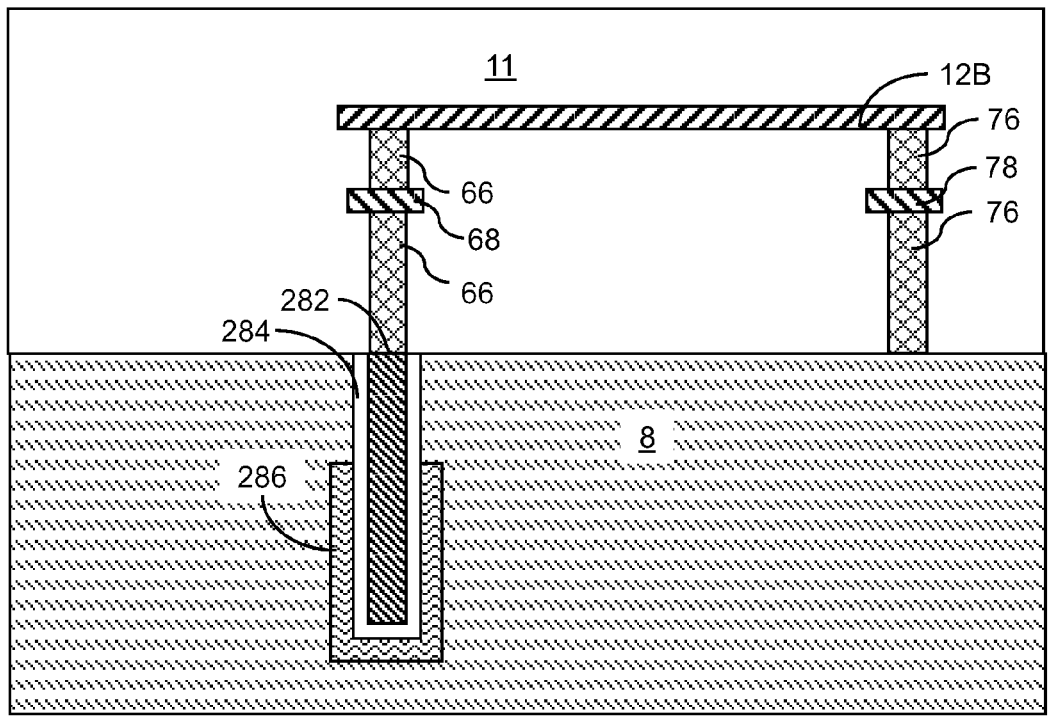
FIG. 8 is a vertical cross-sectional view of yet another first exemplary semiconductor structure according to a third embodiment of the present invention.

Referring to FIG. 8, a vertical cross-sectional view of a third embodiment of the first exemplary semiconductor structure is shown along the plane B-B' in FIG. 3. In the third embodiment, the first capacitor 22 is a deep trench capacitor located in the semiconductor substrate 8. The deep trench capacitor comprises a first capacitor electrode 282, a node dielectric 284, and a second capacitor electrode 286 that are laterally stacked. The second capacitor electrode 286 may be a portion of the semiconductor substrate 8.

The second capacitor electrode 286 laterally abuts and laterally surrounds sidewalls of a deep trench, which is embedded in the semiconductor substrate 8. The first capacitor electrode 284 and the node dielectric 284 are located within the deep trench.

The first capacitor electrode 282 is resistively connected to an end of the second-side first capacitively-grounded metal line 12B through a third assembly of vertically interconnecting structures that include at least one third conductive via structure 66. The second capacitor electrode 286 is electrically grounded to the semiconductor substrate 8. The second capacitor electrode 286 may be formed in proximity to the first signal input structure (not shown). The third assembly may include at least one third metal line structure 68.

The other end of the second-side first capacitively-grounded metal line 12B is connected to electrical ground in proximity to the first signal output structure (not shown) through a fourth assembly of vertically interconnecting structures which includes at least one fourth conductive via structure 76. The fourth assembly may include at least one fourth metal line structure 78.

Figure 9:
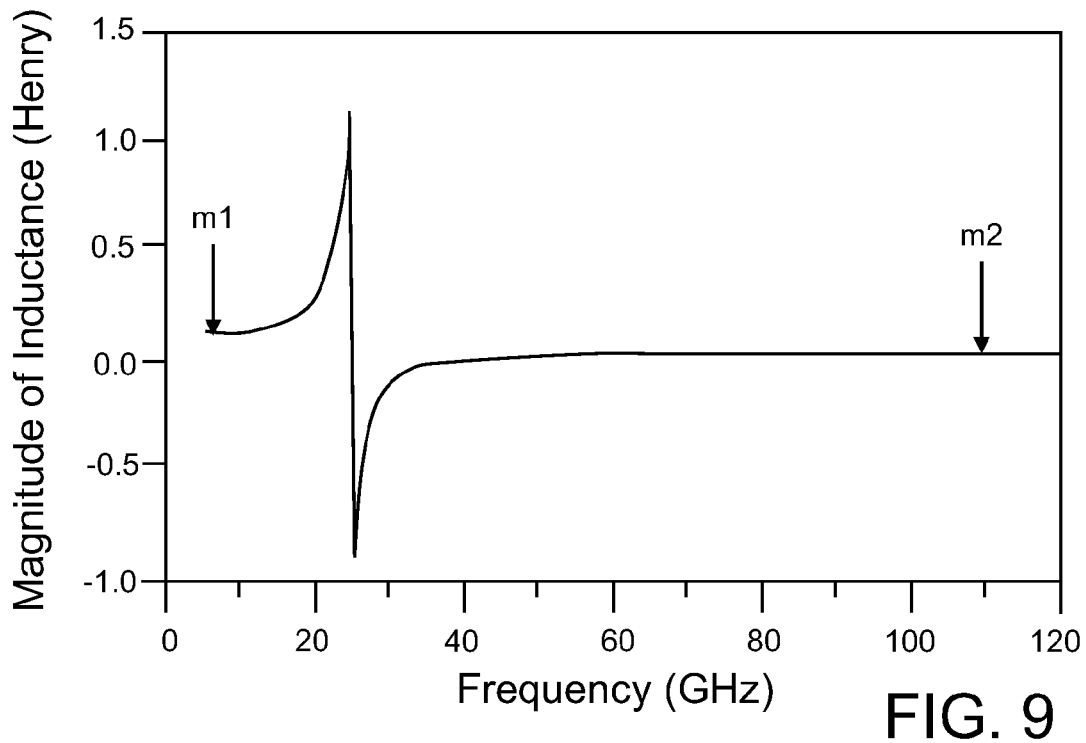
FIG. 9 is a graph showing a frequency dependence of mutual inductance of the second exemplary semiconductor structure.

Referring to FIG. 9, a graph shows a frequency dependence of effective inductance of the first exemplary semiconductor structure under a condition that approximates the second exemplary semiconductor structure represented by the circuit of FIG. 4. In this case, the approximation of the second exemplary semiconductor structure by the first exemplary semiconductor structure shown in FIGS. 2 and 3 is effected by disconnecting the first capacitor 22 from the first exemplary semiconductor structure.

In this simulation, the length d of the metal lines (10, 12A, 12B, 14A, 14B, 18A, 18B; See FIGS. 2 and 3) is set at 160 microns. The width w of the signal transmission line 10 is set at 8 microns. The first width w1 is set at 2 microns, the second width w2 is set at 8 microns, the third width w3 is set at 8 microns, and the thickness t is set at 3 microns. The first spacing S1 is set at 3 microns, the second spacing S2 is set at 8 microns, and the third spacing S3 is set at 9 microns. The value of the second capacitance C2 is set at 0.15 picoFarad (pF). Due to the absence of the first capacitor 22, the effect of the presence of the first-side and second-side first capacitively-grounded metal lines (12A, 12B) is minimal on the simulated total inductance of the signal transmission line 10.

The result of the simulation shows that the total inductance of the signal transmission line 10 is about 0.131 Henry at 6 GHz (marked with a pointer labeled "m1"), and about 0.038 Henry at about 110 GHz (marked with a pointer labeled "m2"). In the absence of the second capacitance C2, the total inductance is determined by the self-inductance of the signal transmission line 10 and the mutual inductance due to the first-side and second-side grounded metal lines (18A, 18B) without the effect of the first-side and second side second capacitively-grounded metal lines (14A, 14B). In this case, the total inductance is expected to be about the same at 6 GHz, but is expected to be about 0.118 Henry at about 110 GHz. Thus, the presence of the first-side and second side second capacitively-grounded metal lines (14A, 14B) and the second capacitor 22 having the second capacitance of 0.15 pF reduces the total inductance of the signal transmission line by a factor of about 68%.

Figure 10:
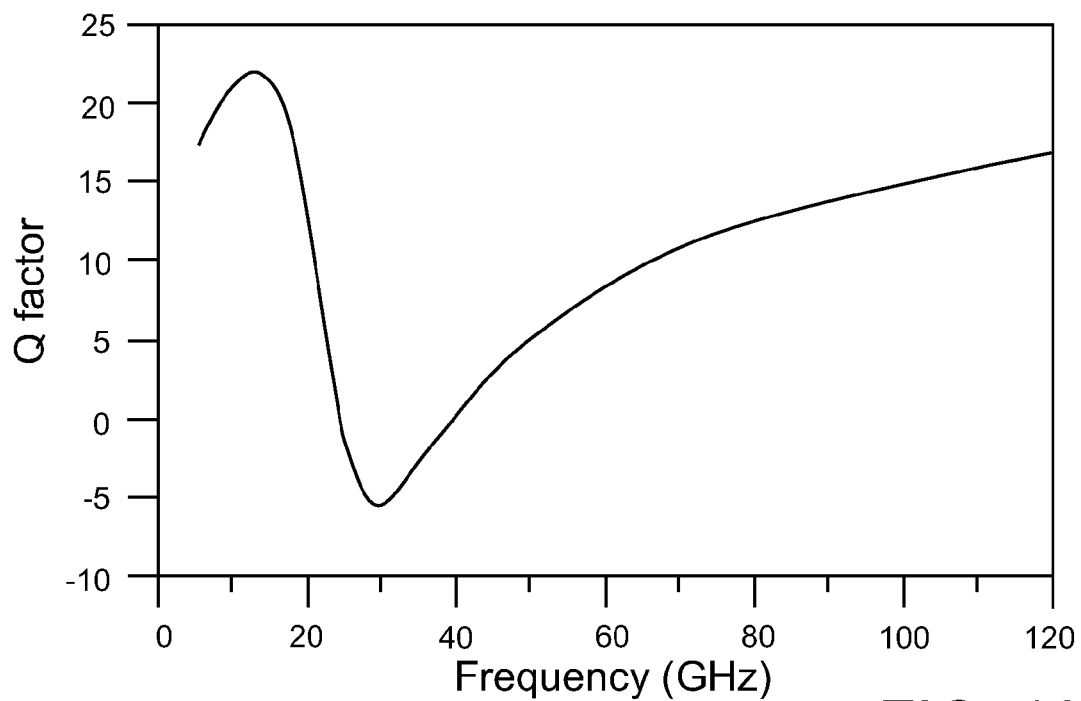
FIG. 10 is a graph showing a frequency dependence of Q factor of the second exemplary semiconductor structure.

FIG. 10 is a graph showing a frequency dependence of Q factor of the first exemplary semiconductor structure under the same condition as in FIG. 9. Any frequency range having a Q-factor greater than 10 is usable for signal transmission. Thus, a first frequency range from about 6 GHz to about 20 GHz and a second frequency range from about 65 GHz to at least about 120 GHz are usable for signal transmission.

Figure 11:
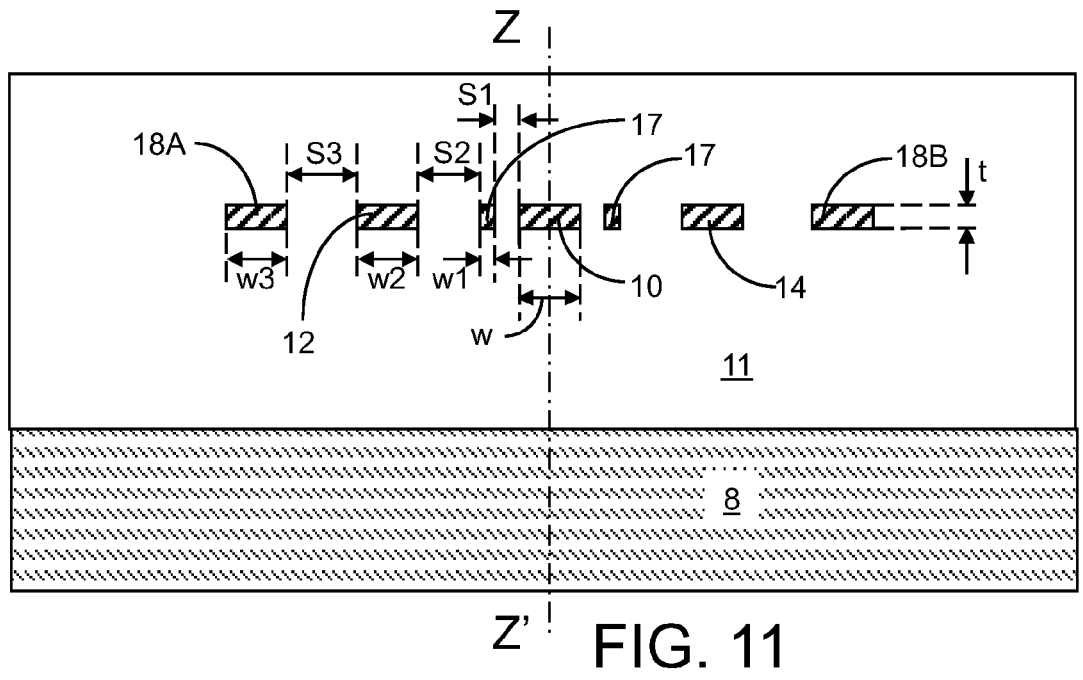
FIG. 11 is a vertical cross-sectional view of a third exemplary semiconductor structure according to the present invention.
Figure 12:
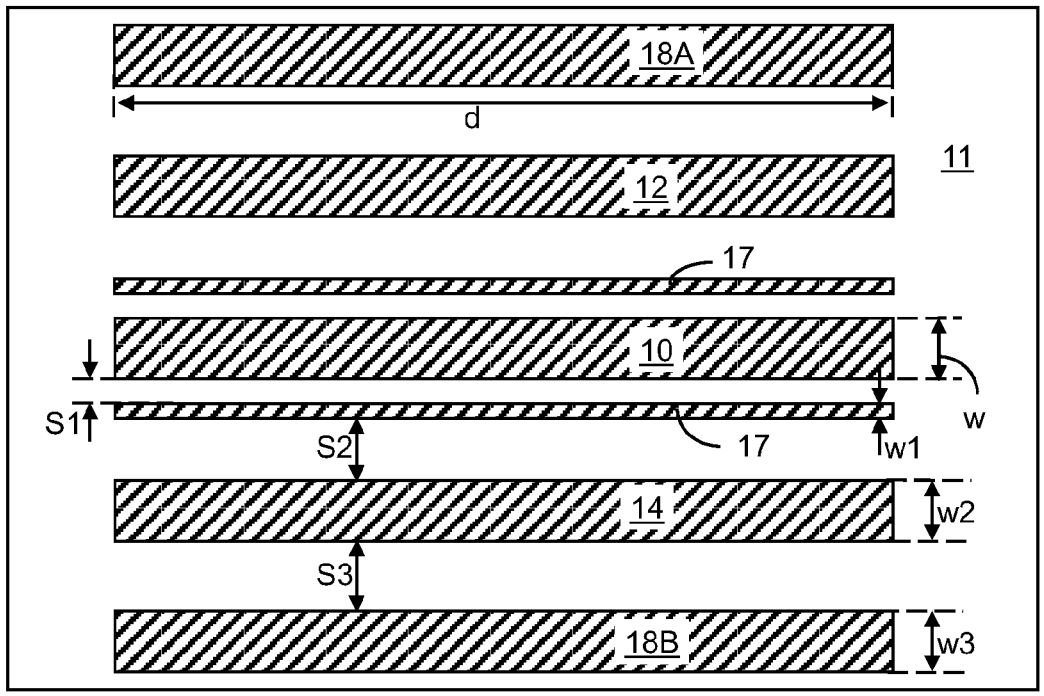
FIG. 12 is a horizontal cross-sectional view of the third exemplary semiconductor structure according to the present invention.

Referring to FIGS. 11 and 12, a third exemplary semiconductor structure according to the present invention is shown. FIG. 11 is a vertical cross-sectional view of the third exemplary semiconductor structure, and FIG. 12 is a horizontal cross-sectional view of the third exemplary semiconductor structure across a horizontal plane including a signal transmission line 10.

The third exemplary semiconductor structure comprises a semiconductor substrate 8 and a dielectric material layer 11, which are the same as in the first exemplary semiconductor structure. The first exemplary semiconductor structure has mirror symmetry around the plane Z-Z' as far as metal lines are concerned. However, the metal lines are wired in a different manner from the first exemplary semiconductor structure. Further, different capacitors are employed.

The first exemplary semiconductor structure includes a signal transmission line 10 having a width w and a thickness t, a pair of electrically disconnected lines 17 having a first width w1, a first capacitively-grounded metal line 12 having a second width w2, a second capacitively-grounded metal line 14 having the second width w2, and a pair of a first-side grounded metal line 18A and a second-side grounded metal line 18B, each having a third width w3. Each of the electrically disconnected lines 17 is spaced from the signal transmission line 10 by a first spacing S1. Each of the first capacitively-grounded metal line 12 and the second capacitively-grounded metal line 14 is spaced from an electrically disconnected line 17 by a second spacing S2. The first-side grounded metal line 18A is laterally spaced from the first capacitively-grounded metal line 12 by a third spacing S3. The second-side grounded metal line 18B is laterally spaced from the second capacitively-grounded metal line 14 by the third spacing S3. All metal lines (10, 17, 12, 14, 18A, 18B) have a length d, and a thickness t.

The pair of electrically disconnected line 17 are electrically disconnected, i.e., not connected to any other electrical component. The first capacitively-grounded metal line 12 is grounded through a first capacitor (not shown), which may be the same as the first capacitor 22 in FIG. 1. The second capacitively-grounded metal line 14 is grounded through a second capacitor (not shown), which may be the same as the second capacitor 24 in FIG. 1. Each of the first-side grounded metal line 18A and the second-side grounded metal line 18B is electrically grounded in the same manner as the grounded metal line 18 in FIG. 1.

Figure 13:
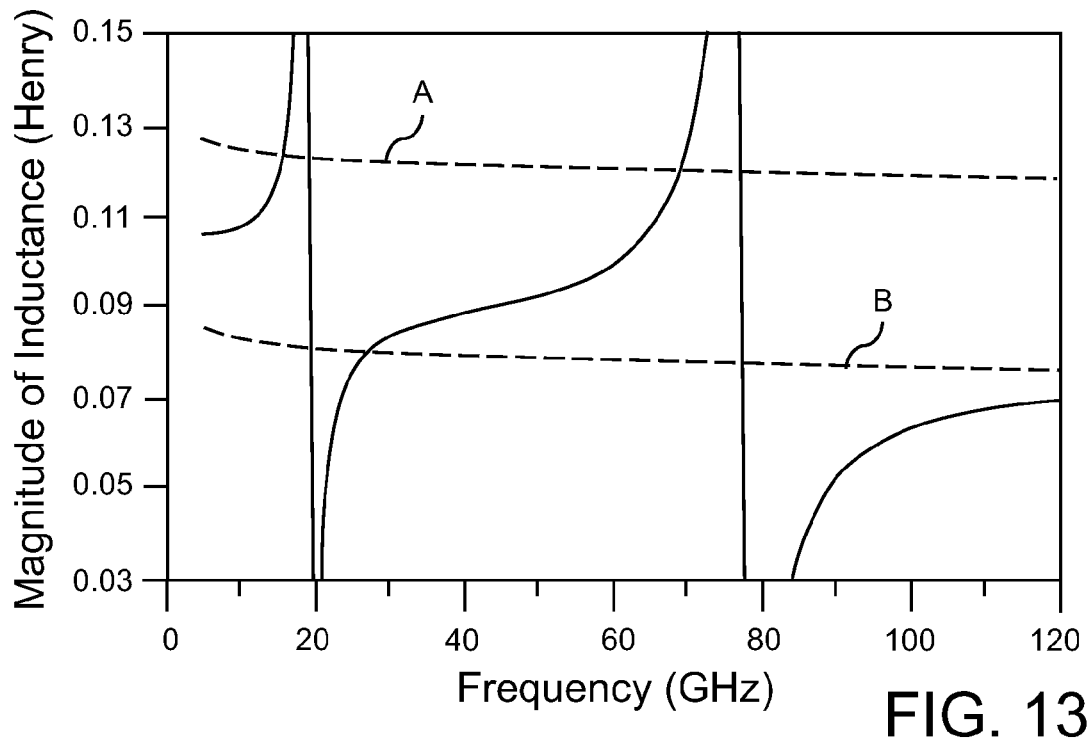
FIG. 13 is a graph showing a frequency dependence of the inductance of the third exemplary semiconductor structure.

Referring to FIG. 13, a graph shows a frequency dependence of effective mutual inductance of the third exemplary semiconductor structure under a simulation condition. Specifically, the length d of the metal lines (10, 17, 12, 14, 18A, 18B; See FIGS. 11 and 12) is set at 160 microns. The width w of the signal transmission line 10 is set at 8 microns. The first width w1 is set at 2 microns, the second width w2 is set at 8 microns, the third width w3 is set at 8 microns, and the thickness t is set at 3 microns. The first spacing S1 is set at 3 microns, the second spacing S2 is set at 8 microns, and the third spacing S3 is set at 9 microns. The value of the first capacitance for the first capacitor, which is attached to the first capacitively-grounded metal line 12, is set at 0.05 pF. The value of the second capacitance for the second capacitor, which is attached to the second capacitively-grounded metal line 14, is set at 0.50 pF. Due to the two different values of the capacitance, the first and second capacitors introduce divergent singularities in the total inductance of the signal transmission line at different frequencies.

The result of the simulation, displayed in a solid line, shows that the total inductance of the signal transmission line 10 displays three plateaus at three different frequency ranges. Dotted line A corresponds to a hypothetical case in which the first capacitively-grounded metal line 12 and the second capacitively-grounded metal line 14 are electrically disconnected. Dotted line B corresponds to another hypothetical case in which the first capacitor and the second capacitor are replaced with a direct connection, i.e., the first capacitively-grounded metal line 12 and the second capacitively-grounded metal line 14 are directly grounded.

Figure 14:
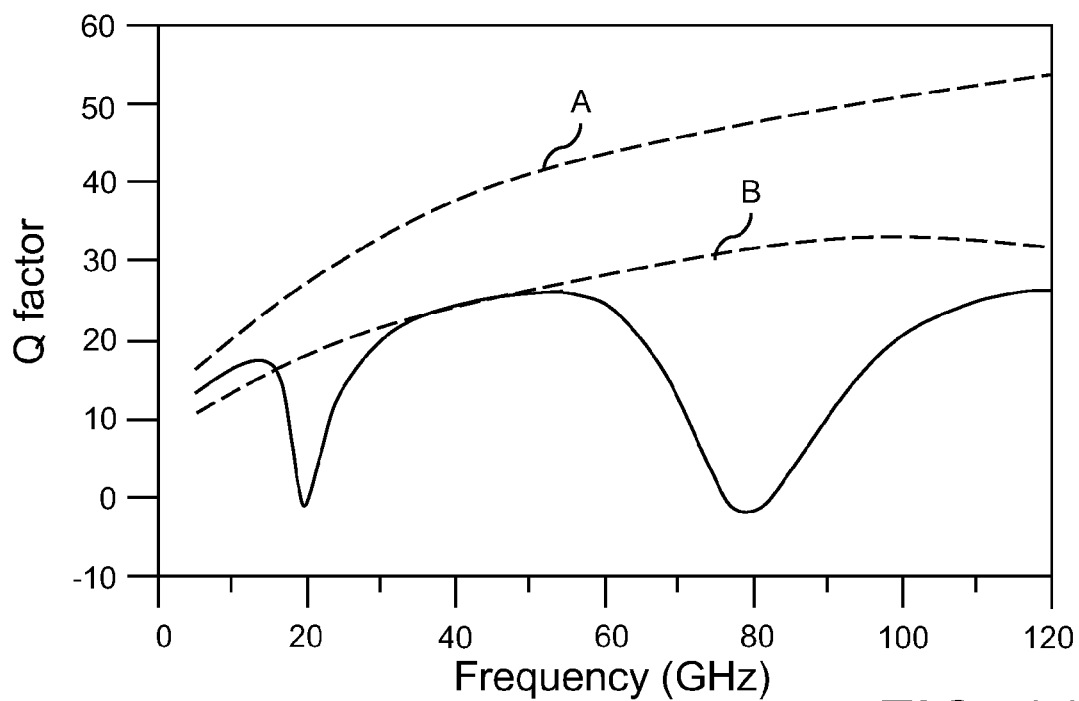
FIG. 14 is a graph showing a frequency dependence of Q factor of the third exemplary semiconductor structure.

FIG. 14 is a graph showing a frequency dependence of Q factor of the first exemplary semiconductor structure under the same condition as in FIG. 13. Since any frequency range having a Q-factor greater than 10 is usable for signal transmission, a first frequency range from about 6 GHz to about 16 GHz and a second frequency range from about 24 GHz to about 65 GHz, and a third frequency range from about 90 GHz to at least about 120 GHz are usable for signal transmission. Within each usable frequency range, a different total inductance value is provided for the signal transmission line 10.

Figure 15:
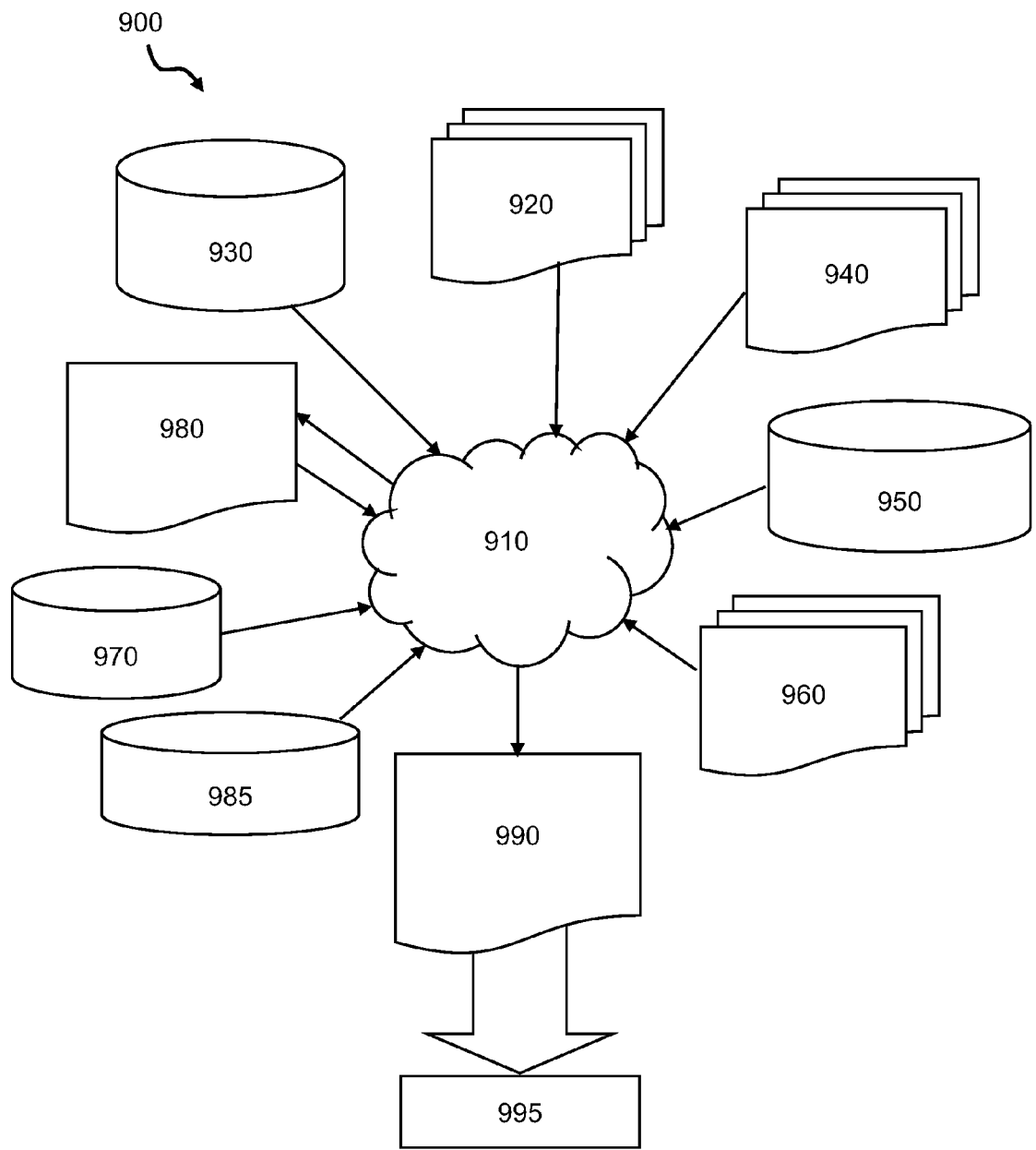
FIG. 15 is a flow diagram of a design process that may be used in design and manufacture of the semiconductor circuits according to the present invention.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 15 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/ or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a first metal line embedded in a dielectric material layer located on a semiconductor substrate and resistively connected to a first device at a first end of said first metal line and resistively connected to a second device at a second end of said first metal line;
a second metal line embedded in said dielectric material layer and inductively coupled with said first metal line through a portion of said dielectric material layer; and
a capacitor having a first capacitor electrode and a second capacitor electrode, wherein said first capacitor electrode is resistively connected to an end of said second metal line, and wherein said second capacitor electrode is electrically grounded, wherein said first metal line includes a first sidewall and said second metal line includes a second sidewall, wherein said first and second sidewalls are substantially parallel to each other and abut said portion of said dielectric material layer and laterally separated from each other by a substantially constant spacing.

2. The semiconductor structure of claim 1, wherein said first device is a signal transmitting device and said second device is a signal receiving device and said first metal line is a signal transmission line.

3. The semiconductor structure of claim 1, wherein said first device includes a first signal input node structure directly connected to said first end of said first metal line and a second signal input node structure directly connected to said semiconductor substrate, and wherein said second device includes a first signal output node structure directly connected to said second end of said first metal line and a second signal output node structure directly connected to said semiconductor substrate.

4. The semiconductor structure of claim 1, wherein said first metal line and said second metal line are located at a same level within said dielectric material layer and spaced from said semiconductor substrate by a same distance.

5. The semiconductor structure of claim 1, wherein said first metal line and said second metal line are located at different levels within said dielectric material layer, wherein a vertical spacing between said first metal line and said semiconductor substrate is different from a vertical spacing between said second metal line and said semiconductor substrate.

6. The semiconductor structure of claim 1, further comprising a grounded metal line embedded in said dielectric material layer and inductively coupled with said first metal line and grounded to said semiconductor substrate at a first end of said grounded metal line in proximity to said first device and grounded to said semiconductor substrate at a second end of said grounded metal line in proximity to said second device or to a system bus ground line.

7. The semiconductor structure of claim 1, further comprising at least one additional capacitively-grounded metal line structure, wherein each of said at least one additional capacitively-grounded line structure comprises:
 an additional metal line embedded in said dielectric layer and inductively coupled with said first metal line through a portion of said dielectric material layer; and
 an additional capacitor having a first additional capacitor electrode and a second additional capacitor electrode, wherein said first additional capacitor electrode is resistively connected to an end of said additional metal line, and wherein said second additional capacitor electrode is electrically grounded.

8. The semiconductor structure of claim 7, wherein a magnitude of impedance of said additional capacitor is equal to a magnitude of a sum of said first impedance due to self-inductance of said first metal line and third impedance due to mutual inductance between said first metal line and said additional metal line within a frequency range between 1 GHz and 1 THz.

9. The semiconductor structure of claim 8, wherein said first metal line and said additional metal line are located at a same level within said dielectric material layer and spaced from said semiconductor substrate by a same distance.

10. A semiconductor structure comprising:
 a first metal line embedded in a dielectric material layer located on a semiconductor substrate and resistively connected to a first device at a first end of said first metal line and resistively connected to a second device at a second end of said first metal line;
 a second metal line embedded in said dielectric material layer and inductively coupled with said first metal line through a portion of said dielectric material layer;
 a capacitor having a first capacitor electrode and a second capacitor electrode, wherein said first capacitor electrode is resistively connected to an end of said second metal line, and wherein said second capacitor electrode is electrically grounded; and
 a grounded metal line embedded in said dielectric material layer and inductively coupled with said first metal line and grounded to said semiconductor substrate at a first end of said grounded metal line in proximity to said first device and grounded to said semiconductor substrate at a second end of said grounded metal line in proximity to said second device or to a system bus ground line.

11. The semiconductor structure of claim 10, wherein said first device is a signal transmitting device and said second device is a signal receiving device and said first metal line is a signal transmission line.

12. The semiconductor structure of claim 10, wherein said first device includes a first signal input node structure directly connected to said first end of said first metal line and a second signal input node structure directly connected to said semiconductor substrate, and wherein said second device includes a first signal output node structure directly connected to said second end of said first metal line and a second signal output node structure directly connected to said semiconductor substrate.

13. The semiconductor structure of claim 10, wherein said first metal line and said second metal line are located at a same level within said dielectric material layer and spaced from said semiconductor substrate by a same distance.

14. A semiconductor structure comprising:
 a first metal line embedded in a dielectric material layer located on a semiconductor substrate and resistively connected to a first device at a first end of said first metal line and resistively connected to a second device at a second end of said first metal line;
 a second metal line embedded in said dielectric material layer and inductively coupled with said first metal line through a portion of said dielectric material layer;
 a capacitor having a first capacitor electrode and a second capacitor electrode, wherein said first capacitor electrode is resistively connected to an end of said second metal line, and wherein said second capacitor electrode is electrically grounded;
 at least one additional capacitively-grounded metal line structure, wherein each of said at least one additional capacitively-grounded line structure comprises:
 an additional metal line embedded in said dielectric layer and inductively coupled with said first metal line through a portion of said dielectric material layer; and
 an additional capacitor having a first additional capacitor electrode and a second additional capacitor electrode, wherein said first additional capacitor electrode is resistively connected to an end of said additional metal line, and wherein said second additional capacitor electrode is electrically grounded.

15. The semiconductor structure of claim 14, wherein a magnitude of impedance of said additional capacitor is equal to a magnitude of a sum of said first impedance due to self-inductance of said first metal line and third impedance due to mutual inductance between said first metal line and said additional metal line within a frequency range between 1 GHz and 1 THz.

16. The semiconductor structure of claim 15, wherein said first metal line and said additional metal line are located at a same level within said dielectric material layer and spaced from said semiconductor substrate by a same distance.

17. The semiconductor structure of claim 14, wherein said first device is a signal transmitting device and said second device is a signal receiving device and said first metal line is a signal transmission line.

18. The semiconductor structure of claim 14, wherein said first device includes a first signal input node structure directly connected to said first end of said first metal line and a second signal input node structure directly connected to said semiconductor substrate, and wherein said second device includes a first signal output node structure directly connected to said second end of said first metal line and a second signal output node structure directly connected to said semiconductor substrate.

19. The semiconductor structure of claim 14, wherein said first metal line and said second metal line are located at a same level within said dielectric material layer and spaced from said semiconductor substrate by a same distance.

20. The semiconductor structure of claim 14, wherein said first metal line and said second metal line are located at different levels within said dielectric material layer, wherein a vertical spacing between said first metal line and said semiconductor substrate is different from a vertical spacing between said second metal line and said semiconductor substrate.

* * * * *